US012382615B2

(12) United States Patent
Leizerovich et al.

(10) Patent No.: US 12,382,615 B2
(45) Date of Patent: *Aug. 5, 2025

(54) ELECTRONIC APPARATUS WITH CHANNELED COOLING

(71) Applicant: Ubicquia, Inc., Fort Lauderdale, FL (US)

(72) Inventors: Gustavo Dario Leizerovich, Aventura, FL (US); Ivan Quiroz, Dallas, TX (US); Claudio Santiago Ribeiro, Evanston, IL (US); Cesar Eduardo Nunez, Miramar, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 213 days.

This patent is subject to a terminal disclaimer.

(21) Appl. No.: 18/375,493

(22) Filed: Sep. 30, 2023

(65) Prior Publication Data

US 2024/0032263 A1 Jan. 25, 2024

Related U.S. Application Data

(63) Continuation of application No. 17/563,783, filed on Dec. 28, 2021, now Pat. No. 11,792,964.

(51) Int. Cl.
*H05K 7/20* (2006.01)
(52) U.S. Cl.
CPC .................. *H05K 7/20909* (2013.01)
(58) Field of Classification Search
CPC .................................................. H05K 7/20909
See application file for complete search history.

(56) References Cited

U.S. PATENT DOCUMENTS

| 4,370,700 A | 1/1983 | Duddles et al. |
| 5,777,856 A | 7/1998 | Phillips et al. |

(Continued)

FOREIGN PATENT DOCUMENTS

| CN | 211702797 U | 10/2020 |
| EP | 2034328 A1 | 3/2009 |

OTHER PUBLICATIONS

U.S. Patent & Trademark Office as International Searching Authority, International Search Report issued in connection with counterpart International Application No. PCT/US2022/054128, Apr. 5, 2023, 2 pages.

(Continued)

*Primary Examiner* — Mukundbhai G Patel
(74) *Attorney, Agent, or Firm* — Daniel C. Crilly

(57) ABSTRACT

An apparatus includes a housing and at least one heat-generating electrical module. The housing includes a floor and at least one sidewall portion extending around the floor's perimeter. The sidewall portion(s) includes an air intake section located at a first end of the floor and a first air exhaust section located at a second end of the floor. The floor includes two noncoplanar floor portions and a transition portion interconnecting them. The transition portion, which may be angled, includes a second air exhaust section. The heat-generating module(s) are positioned over and spaced apart from the floor. At least one air flow channel is defined between inside surfaces of the floor and external surfaces of the heat-generating module(s). The apparatus may also include one or more fans that draw air in through the air intake section and force air through the air flow channel(s) and out the air exhaust sections.

20 Claims, 11 Drawing Sheets

(56) References Cited

U.S. PATENT DOCUMENTS

| | | | |
|---|---|---|---|
| 6,364,216 | B1 | 4/2002 | Martin |
| 6,624,432 | B1 | 9/2003 | Gabower et al. |
| 8,018,734 | B2 | 9/2011 | Brewer et al. |
| 9,192,079 | B2 * | 11/2015 | Loth .................. H05K 7/20918 |
| 11,653,436 | B2 | 5/2023 | Vendetti et al. |
| 11,844,151 | B2 | 12/2023 | Leizerovich et al. |
| 2018/0027359 | A1 | 1/2018 | Gonzalez et al. |
| 2018/0045388 | A1 | 2/2018 | McDowell et al. |
| 2019/0341732 | A1 | 11/2019 | Zimmerman, III et al. |
| 2020/0080695 | A1 | 3/2020 | Lalos et al. |
| 2020/0195304 | A1 | 6/2020 | Vannucci et al. |
| 2020/0359462 | A1 | 11/2020 | Zimmerman, III et al. |
| 2020/0373682 | A1 | 11/2020 | Root et al. |
| 2021/0100065 | A1 | 4/2021 | Lee et al. |
| 2021/0167811 | A1 | 6/2021 | Henry et al. |
| 2021/0305689 | A1 | 9/2021 | Leizerovich et al. |

OTHER PUBLICATIONS

U.S. Patent & Trademark Office as International Searching Authority, Written Opinion of the International Searching Authority issued in connection with counterpart International Application No. PCT/US2022/054128, Apr. 5, 2023, 4 pages.

U.S. Patent & Trademark Office as International Searching Authority, International Search Report issued in connection with International Application No. PCT/US2022/054126, Mar. 21, 2023, 2 pages.

U.S. Patent & Trademark Office as International Searching Authority, Written Opinion of the International Searching Authority issued in connection with International Application No. PCT/US2022/054126, Mar. 21, 2023, 4 pages.

U.S. Patent & Trademark Office as International Searching Authority, International Search Report issued in connection with International Application No. PCT/US2022/054121, Apr. 18, 2023, 2 pages.

U.S. Patent & Trademark Office as International Searching Authority, Written Opinion of the International Searching Authority issued in connection with International Application No. PCT/US2022/054121, Apr. 18, 2023, 6 pages.

U.S. Patent & Trademark Office as International Searching Authority, International Search Report issued in connection with International Application No. PCT/US2022/054123, Jun. 21, 2023, 4 pages.

U.S. Patent & Trademark Office as International Searching Authority, Written Opinion of the International Searching Authority issued in connection with International Application No. PCT/US2022/054123, Jun. 21, 2023, 5 pages.

* cited by examiner

ELECTRONIC APPARATUS WITH CHANNELED COOLING

CROSS-REFERENCE TO RELATED APPLICATIONS

The present application is a continuation of U.S. application Ser. No. 17/563,783, now U.S. Pat. No. 11,792,964, which was filed on Dec. 28, 2021, and is incorporated herein by reference in its entirety.

TECHNICAL FIELD

The present disclosure relates generally to thermal management in electronic devices or systems and, more particularly, to an electronic apparatus with a channeled cooling configuration.

BACKGROUND

In some electrical or electronic devices, particularly those having power electronics, thermal management is a critical issue. Heat generated from power electronics can negatively affect the performance of those electronics and nearby devices if the heat is not removed. A conventional way of removing heat from electronic elements, such as devices or modules, is through use of a heat sink. The electronic elements producing heat are placed in physical and/or thermal contact with a heat sink to draw heat away from the elements. In certain circumstances, heat sinks and the electronic elements to which they are mounted may be oriented such that the fins of the heat sinks point upward. Such an orientation may allow for convective cooling of the heat sink because hot air naturally rises. In other circumstances, one or more fans are used to blow cool or ambient temperature air over the fins of the heat sink to remove heat out of the system.

Electronic systems that include electronic elements mounted to heat sinks may be installed in exposed outdoor locations, which are subject to precipitation, including snow and rain. Water entering such an electronic system needs to be fully or partially drained to prevent the water from negatively impacting the electronics of the system. Thus, outdoor electronic systems using cooling fans may require clearance below the electronic elements of the system to facilitate some collection of water until drainage elements, such as holes, can eliminate most, if not all, the water. As a result, housings of electronic systems intended for outdoor use do not typically facilitate low profile applications where the housings must accommodate both water drainage and one or more fan-cooled heat sinks.

SUMMARY

In accordance with some exemplary embodiments of the present disclosure, an apparatus includes a housing, at least one heat-generating electrical or electronic module, and at least one fan. The housing includes a floor and at least one sidewall portion extending around a perimeter of the floor. An air intake section of the at least one sidewall portion is located at a first lengthwise end of the floor and defines an air intake port (e.g., a set of air intake apertures). An air exhaust section of the at least one sidewall portion is located at a second lengthwise end of the floor and defines a first air exhaust port (e.g., a first set of air exhaust apertures). The floor includes a first floor portion residing primarily in a first plane, a second floor portion residing primarily in a second plane, and a transition portion interconnecting the first floor portion and the second floor portion. The transition portion of the floor defines a second air exhaust port (e.g., a second set of air exhaust apertures). The at least one heat-generating module is positioned over and spaced apart from the first floor portion and at least part of the second floor portion of the housing. At least one air flow channel is defined between inside surfaces of the housing floor portions and at least one external surface of the one or more heat-generating modules. The external surface or surfaces of the one or more heat-generating modules may be external surfaces of the modules or the modules' heat sink fins. The at least one fan is positioned proximate the air intake port. So positioned, the at least one fan is operable to draw air into the housing through the air intake port and force the air through the at least one air flow channel and out the first and second air exhaust ports. The apparatus may be suitable for implementing a small cell access node or small cell networking device (sometimes referred to as just a "small cell") or any other type of electronic device or system.

In accordance with some alternative embodiments of the present disclosure, an apparatus includes at least two housing members, at least two heat-generating electrical modules, and at least one fan. A first one of the housing members includes a floor and a first sidewall portion. The first sidewall portion is located at a first lengthwise end of the floor and defines an air intake port (e.g., a set of air intake apertures). The floor includes a first floor portion residing primarily in a first plane, a second floor portion residing primarily in a second plane substantially parallel to the first plane, and a transition portion interconnecting the first floor portion and the second floor portion. The transition portion of the floor defines a first air exhaust port (e.g., a first set of air exhaust apertures). The second housing member is connected to the first housing member and includes at least a second sidewall portion. The second sidewall portion extends around at least part of a perimeter of the floor and defines a second air exhaust port (e.g., a second set of air exhaust apertures) at a second lengthwise end of the floor. At least a first heat-generating module is positioned over and spaced apart from the first floor portion of the first housing member and at least a second heat-generating module is positioned over and spaced apart from at least part of the second floor portion of the first housing member such that the first heat-generating module and the second heat-generating module are oriented in a generally serial arrangement along a length of the first housing member. Inside surfaces of the first and second floor portions and external surfaces of the first and second heat-generating modules define at least one air flow channel therebetween. The at least one fan is positioned proximate the air intake port and operable to draw air in through the air intake port. The fan or fans force the indrawn air through the at least one air flow channel and out the first and second air exhaust ports. The apparatus may be suitable for implementing a small cell or any other type of electronic device or system.

In accordance with further alternative embodiments of the present disclosure, an apparatus includes a housing, at least one heat-generating electrical module, and at least one fan. The housing includes a floor portion and at least one sidewall portion extending around a perimeter of the floor portion. An air intake section of the at least one sidewall portion is located at a first lengthwise end of the floor portion and defines an air intake port (e.g., a set of air intake apertures). An air exhaust section of the at least one sidewall portion is located at a second lengthwise end of the floor portion and defines a first air exhaust port (e.g., a first set of air exhaust apertures). The floor portion includes a first generally planar floor section residing in a first plane, a second generally planar floor section residing in a second plane substantially parallel to the first plane, and an angled transition section interconnecting the first floor section and the second floor section. The transition section defines a second air exhaust port (e.g., a second set of air exhaust apertures). The at least one heat-generating module is positioned over and spaced apart from the first floor section and at least a portion of the second floor section of the housing. The inside surfaces of the first and second floor sections and at least one external surface of the at least one heat-generating module define at least one air flow channel therebetween. The at least one fan is positioned proximate the air intake port. The at least one fan is operable to draw air into the housing through the set of air intake apertures and force the air through the at least one air flow channel and out the first and second sets of air exhaust apertures. The apparatus may be suitable for implementing a small cell or any other type of electronic device or system.

Although the present disclosure illustrates and describes an apparatus suitable for implementing an electronic device or system, it is nevertheless not intended to be limited to the details shown because various modifications and structural changes may be made without departing from the spirit of the disclosure and while remaining within the scope and range of equivalents of the claims. Additionally, well-known elements of the apparatus will not be described in detail or will be omitted so as not to obscure the relevant details of the apparatus.

Features that are considered characteristic of the apparatus are set forth in the appended claims. As required, detailed embodiments of the apparatus are disclosed herein; however, it is to be understood that the disclosed embodiments are merely exemplary, and the apparatus may be embodied in various forms. Therefore, specific structural and functional details disclosed herein are not to be interpreted as limiting, but rather should be interpreted as providing support for the claims and a representative disclosure appropriate for one of ordinary skill in the art to advantageously employ the claimed invention in appropriately detailed structures. Further, the terms and phrases used herein are not intended to be limiting; but rather are intended to provide an understandable description of the disclosure. While the specification concludes with claims defining the features of the invention, it is believed that the claimed invention will be better understood from a consideration of the following description in conjunction with the drawing figures, in which like reference numerals are used to refer to like elements and structures. The figures of the drawings are not drawn to scale.

The terminology used herein is for the purpose of describing particular embodiments only and is not intended to be limiting. The terms "a" or "an," as used herein, are defined as one or more than one. The term "plurality," as used herein, is defined as two or more. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing," as used herein, is defined in its broadest sense (e.g., bringing/coming into physical existence, making available, and/or supplying to someone or something, in whole or in multiple parts at once or over a period of time).

As used in this description, unless otherwise specified, azimuth or positional relationships indicated by terms such as "up," "down," "left," "right," "inside," "outside," "over," "under," "front," "back," "head," "tail," "top," "bottom," "front," "rear," "above," "below," and so on are based on azimuth or positional relationships shown in the drawings, which are provided only to facilitate description of the embodiments of the present disclosure and to simplify the description, but not to indicate or imply that the devices or components must have a specific azimuth, or be constructed or operated in the specific azimuth. Furthermore, terms such as "first," "second," "third," and so on are only used for descriptive purposes and are not to be construed as indicating or implying relative importance.

As used in this description, unless otherwise clearly defined and limited, terms such as "installed," "coupled," and "connected" should be broadly interpreted to mean fixedly connected, detachably connected, integrally connected, mechanically connected, electrically connected, directly connected, or indirectly connected via an intermediate medium or intermediate media. As used herein, the terms "about," "approximately," or "substantially" apply to all numeric values, whether or not explicitly indicated, and shall include a range of plus or minus thirty percent of the relevant value, unless otherwise expressly stated. In other words, the terms "about," "approximately," and "substantially" generally refer to a range of numbers that one of skill in the art would consider equivalent to the recited values (i.e., having the same function or result). In many instances, such terms may include numbers that are rounded to the nearest significant figure. In this document, the term "longitudinal" should be understood to mean in a direction corresponding to an elongated direction of a device, housing, floor, sidewall, or apparatus. Those skilled in the art can understand the specific meanings of the above-mentioned terms in the embodiments of the present disclosure according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present disclosure.

DETAILED DESCRIPTION

Figure 1:
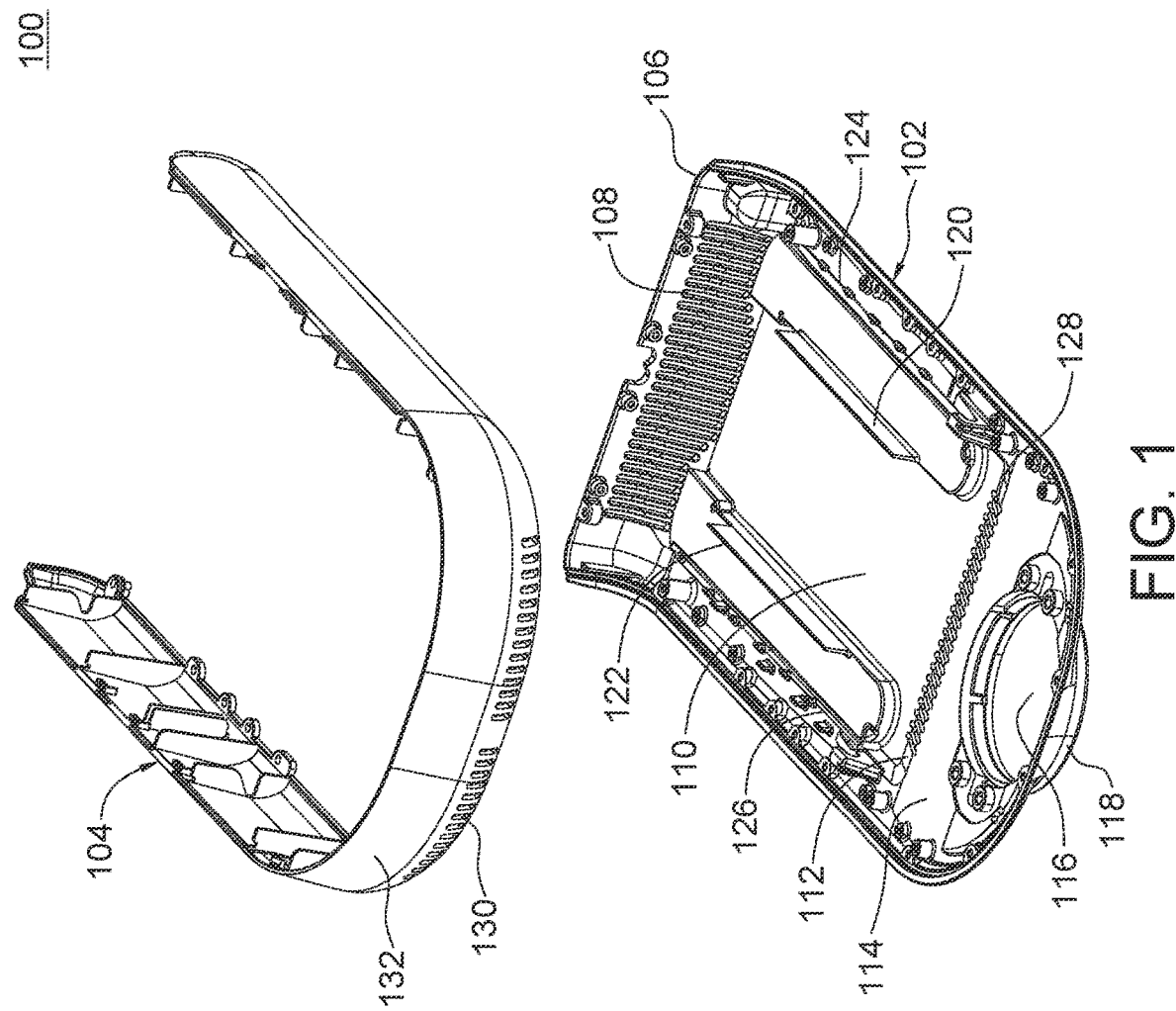
FIG. 1 illustrates a perspective exploded view of a housing for an apparatus suitable for implementing an electronic device or system, in accordance with an exemplary embodiment of the present disclosure.

FIG. 1 illustrates a perspective exploded view of a housing 100 for an apparatus suitable for implementing an electronic device or system, in accordance with one exemplary embodiment of the present disclosure. The electronic device or system may be a small cell, which is a fixed-location telecommunications device that facilitates, among other things, communication between mobile devices and a wireless communication system infrastructure. The electronic device or system may include other functionality also, including a light controller (where the device or system is mounted to a streetlight pole or atop a luminaire of a streetlight), power metering, Wi-Fi, and a GPS receiver. FIGS. 2-11 show the housing 100 and other electronic device components in various states and from various views, so like reference numerals are used throughout the drawings. Accordingly, reference can be made to any or all of the drawings described in the following description.

In addition to the housing 100, the apparatus includes one or more heat-generating electrical or electronic modules, and one or more fans. The housing 100 is configured to manage the heat output(s) of the electrical module(s). The apparatus accomplishes thermal management by drawing air (cool or ambient air) in through an air intake port 108 at one end of the housing 100, routing the air through one or more air flow channels under the electrical module(s), and utilizing two separate air exhaust ports 128, 130 in the housing 100 to exhaust the heated air out of the apparatus. The air exhaust ports 128, 130 are arranged in stages such that one air exhaust port 128 is located in a transition portion 112 of a floor of the housing 100 and another air exhaust port 130 is located in a sidewall portion 132 of the housing 100 at a lengthwise end of the housing 100 opposite from the end containing the air intake port 108.

Figure 7:
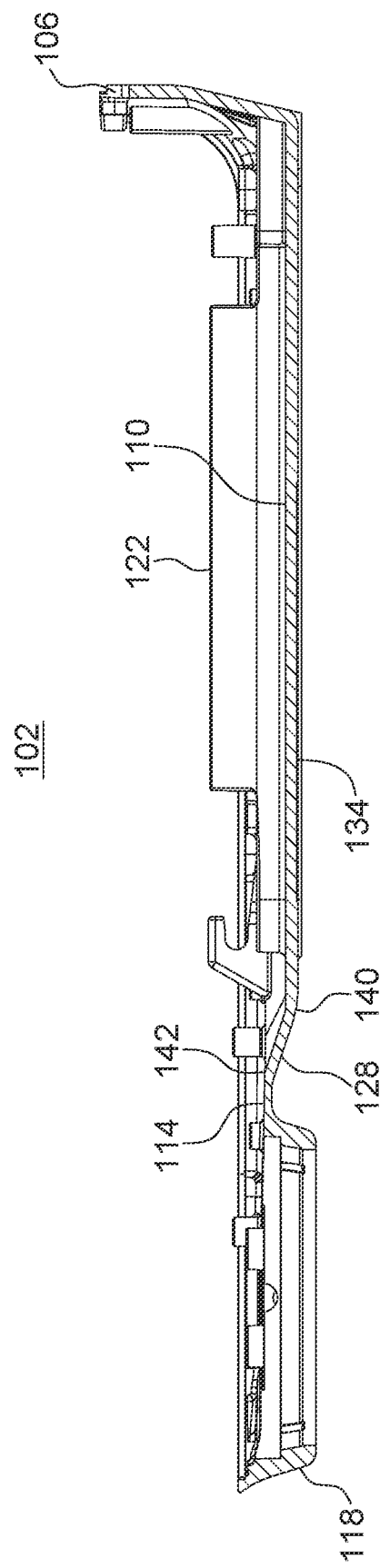
FIG. 7 illustrates a side cut-away view of the lower housing member of FIG. 6.

According to the exemplary embodiment illustrated in FIGS. 1 and 7, the housing 100 includes a lower housing member 102 and a sidewall housing member 104. The lower housing member 102 defines a floor having a first floor portion 110, a second floor portion 114, and the transition portion 112. The transition portion 112 of the floor interconnects the first floor portion 110 and the second floor portion 114.

The lower housing member 102 may also include a back or rear sidewall portion 106 located at a first lengthwise end of the floor. The rear sidewall portion 106 defines the air intake port 108 and has a width, as measured along a direction perpendicular to the longitudinal axis of the housing 100, that is approximately equal to a width of the first floor portion 110.

According to one exemplary embodiment as shown in FIG. 1, the air intake port 108 includes a set of air intake apertures through which air can be drawn into the housing 100 from outside of the housing 100. The air intake apertures may be holes, slits, slots, or any other openings sized and shaped to permit the flow of air while preferably mitigating ingress of foreign matter. Alternatively, the air intake apertures may be covered with a screen or mesh to further help keep out foreign matter. Additionally or alternatively, the sidewall portion 106 defining the air intake port 108 may be angled slightly away from the interior of the housing 100 so as to cause the air intake port 108 to be angled slightly downward and toward the ground when the apparatus is installed at an elevated location in an outside environment. Such orientation of the air intake port 108 makes it less prone to water intrusion from rain and snow after the apparatus has been installed.

The first floor portion 110 is generally a flat or substantially flat surface that resides primarily in a first plane. The first floor portion 110 extends substantially from the back sidewall portion 106 to a lower end 140 (see FIG. 7) of the transition portion 112 of the floor. The second floor portion 114 resides primarily in a second plane and extends from an upper end 142 (see FIG. 7) of the floor's transition portion 112 toward a second lengthwise end of the floor. Because the first and second floor portions 110, 112 reside primarily in different planes (e.g., the first floor portion 110 and the second floor portion 114 are at different levels), the transition portion 112 may be tapered or angled. In some embodiments, the transition portion 112 can be at an angle in the range of about ninety-five degrees (about five degrees off vertical) to about one hundred thirty-five degrees (about forty-five degrees off vertical) relative to the plane of the first floor portion 110. In more preferable embodiments, the transition portion 112 can be at an angle of ten degrees to twenty-five degrees relative to the plane of the first floor portion 110, or alternatively, to the horizontal direction when the device is properly mounted and leveled.

The transition portion 112 of the floor defines an air exhaust port 128 that may include a first set of air exhaust apertures through which air can escape from the interior of the housing 100 through convention or by force from one or more fans. The air exhaust apertures may be holes, slits, slots, or any other openings sized and shaped to permit the flow of air while preferably mitigating ingress of foreign matter. Alternatively, the air exhaust apertures may be covered with a screen or mesh to further help keep out foreign matter. In one exemplary embodiment, the air exhaust apertures may be a series of longitudinal slits oriented in the lengthwise direction of the lower housing member 102. In some embodiments, at least some of the air exhaust apertures forming the transition portion's air exhaust port 128 extend to the first floor portion 110 to facilitate water drainage out of the housing 100 in the event of water ingress into the housing 100. In other embodiments, the first floor portion 110 and the second floor portion 114 can be slightly angled in order to direct any water that enters the housing 100 to flow toward the transition portion's air exhaust port 128 to drain out of the housing 100.

Figure 4:
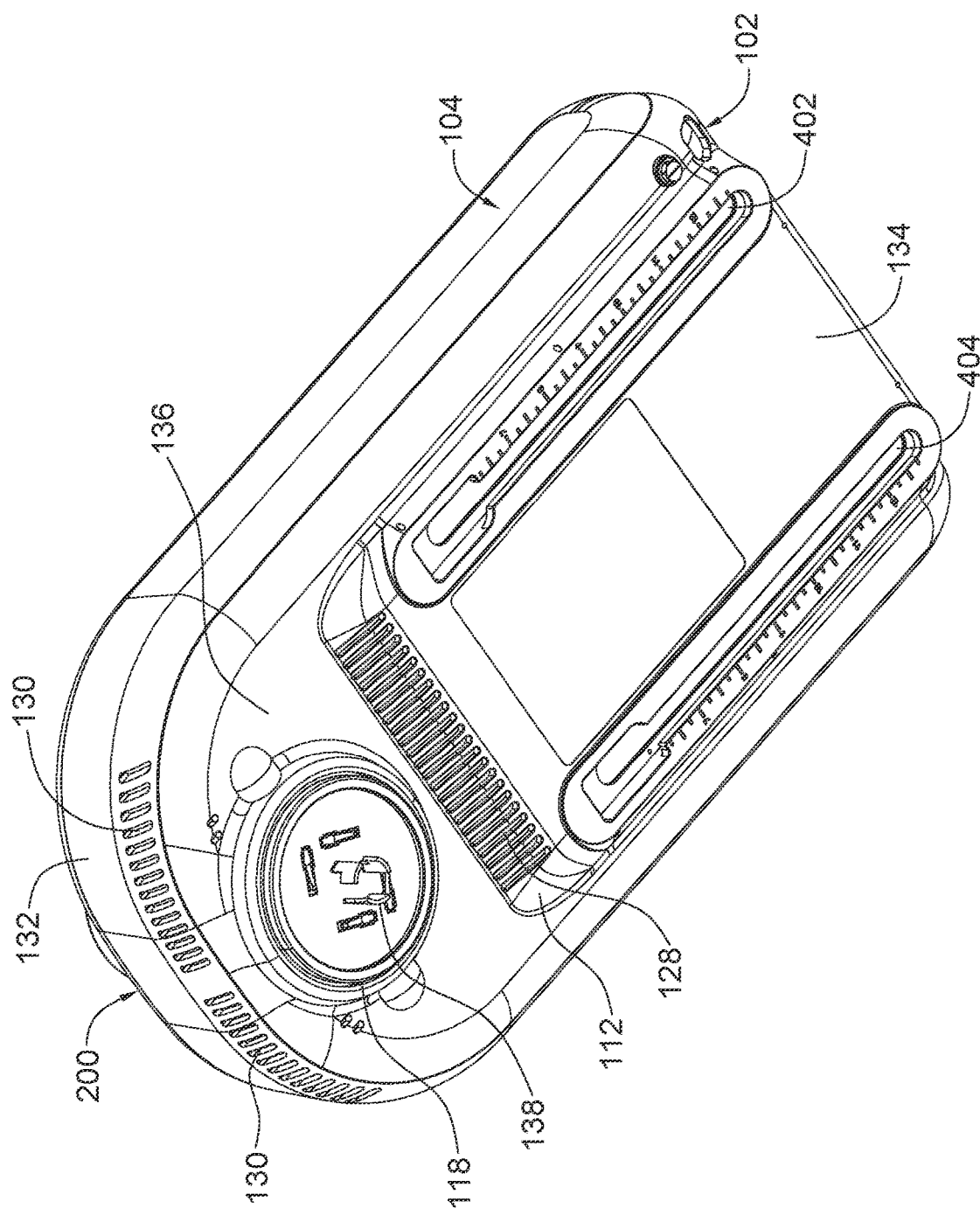
FIG. 4 illustrates a bottom perspective view of an apparatus suitable for implementing an electronic device or system, which includes the housing of FIG. 1, in accordance with an alternative exemplary embodiment of the present disclosure.

The second floor portion 114 may define an opening 116 that is sized to receive and retain an electrical connector, such as a vertically-oriented electrical connector 138 (as shown in FIG. 4) configured to connect to an outdoor aerial lighting fixture (e.g. a streetlight fixture). A boss 118 or other supportive structure may extend downward from a bottom surface 136 of the lower housing member 102 proximate the opening 116 to support the electrical connector. The electrical connector can include a housing or other components, such as an O-ring or gasket, that fits within the opening 116 and seals the opening 116 against intrusion of water or other foreign matter.

The first floor portion 110 may include one or more medial walls 120, 122 (two shown for illustrative purposes), which run in the lengthwise direction of the lower housing member 102 and are oriented substantially orthogonal to the first floor portion 110. The medial walls 120, 122 assist in forming air flow channels when other components of the apparatus are placed into their appropriate locations within the housing 100. For example, each medial wall 120, 122 may be spaced a distance from a respective sidewall portion to define multiple air flow channels between the medial walls 120, 122, and between each medial wall 120, 122 and the sidewall housing member 104. A main or central air flow channel between the medial walls 120, 122 may be used to aid the cooling of one or more heat-generating electrical modules positioned and spaced apart from the first floor portion 110 of the lower housing member 102. For example, the heat-generating electrical module or modules or sections thereof may be placed atop the medial walls 120, 122 and receive additional support from portions of the sidewall housing member 104 and/or from posts or similar elements configured on or into the first floor portion 110. Heated air generated from the heat-generating electrical module(s) and flowing through the central air flow channel exits the housing 100 primarily through the exhaust port 128 in the transition portion 112 of the floor. Side air flow channels 124, 126 may be formed between the medial walls 120, 122 and the sidewall housing member 104 to route cool toward the front of the housing 100, where such air may aid the cooling of one or more other heat-generating electrical modules positioned at least partially over and spaced apart from the second floor portion 114. Such additional heat-generating electrical module(s) may be positioned at least partially over and spaced apart from the first floor portion 110 and the second floor portion 114 such that the heat-generating electrical module(s) straddles the transition portion 112 of the floor. Heated air generated from the forward heat-generating electrical module(s) and flowing from the side air flow channels 124, 126 exits the housing 100 primarily through the exhaust port 130 in the front sidewall portion 132 of the sidewall housing member 104.

The exemplary sidewall housing member 104 shown in FIG. 1 is generally U-shaped and, together with the rear sidewall portion 106 of the lower housing member 102, forms the vertical sidewall of the housing 100. The floor, sidewall, and cover of the housing 100 defines a volume of the apparatus. The sidewall housing member 104 connects to the lower housing member 102 around a periphery of the lower housing member 102 and abuts the rear sidewall portion 106 of the lower housing member 102 at opposite ends of the rear sidewall portion 106. The sidewall housing member 104 includes a front sidewall portion 132 that is positioned opposite the rear sidewall portion 106 of the lower housing member 102 along the length of the housing 100. The front exhaust port 130 is formed in the front sidewall portion 132 of the sidewall housing member 104.

Similar to the housing's other exhaust ports 108, 128, the front exhaust port 130 may include a set of air exhaust apertures through which air can escape from the interior of the housing 100 through convention or by force from one or more fans. The air exhaust apertures of the front exhaust port 130 may be holes, slits, slots, or any other openings sized and shaped to permit the flow of air while preferably mitigating ingress of foreign matter. Alternatively, the air exhaust apertures may be covered with a screen or mesh to further help keep out foreign matter. In one exemplary embodiment, the air exhaust apertures may be a series of spaced apart slits oriented substantially vertically along the lower half of the front sidewall portion 132.

Figure 2:
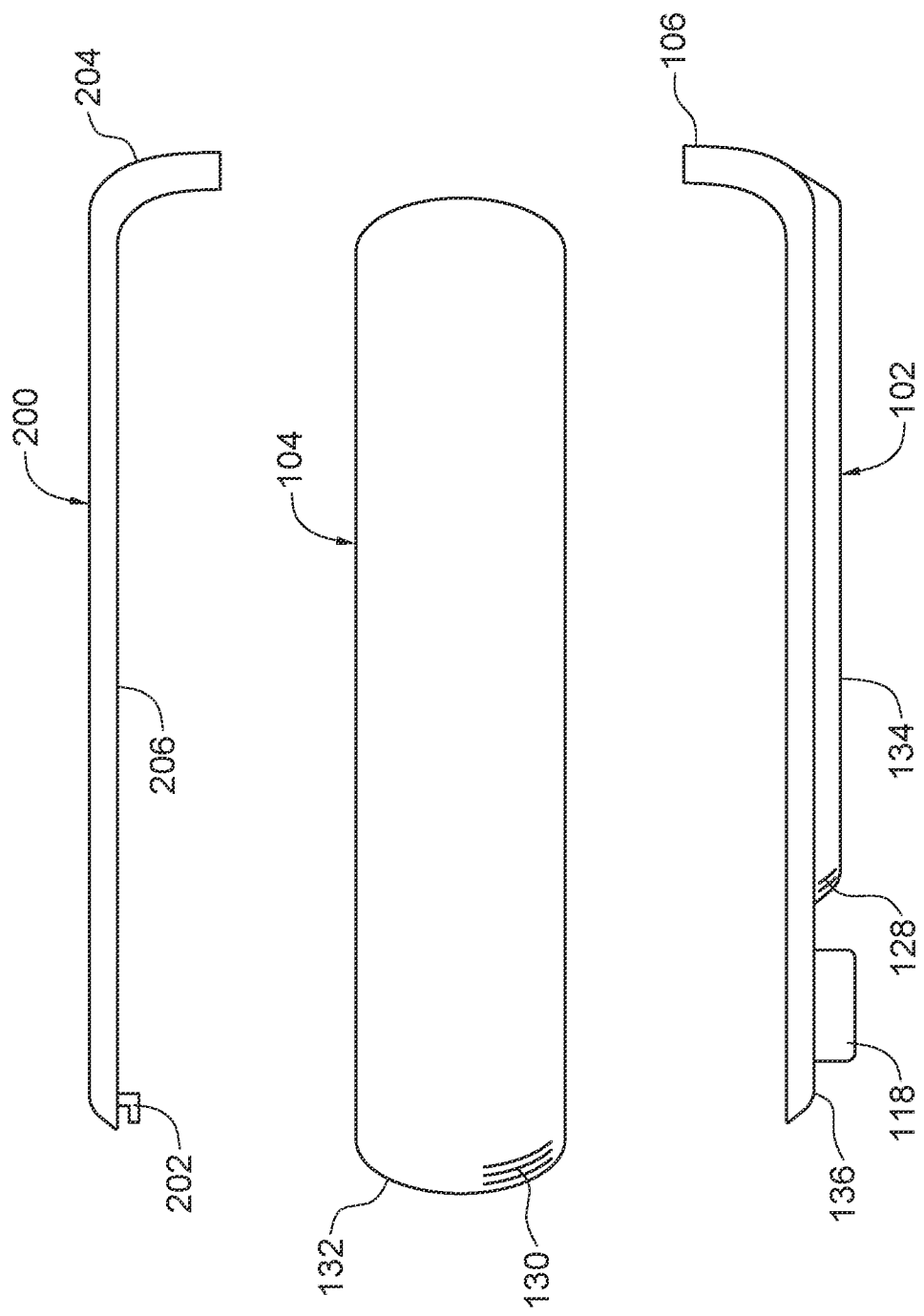
FIG. 2 illustrates a side elevational exploded view of the housing of FIG. 1 with the addition of an exemplary cover, in accordance with an alternative exemplary embodiment of the present disclosure.

FIG. 2 illustrates a side elevational exploded view of the housing 100 of FIG. 1 with the addition of an exemplary cover 200, in accordance with an alternative exemplary embodiment of the present disclosure. The cover 200 is sized and shaped to engage the top of the sidewall housing member 104 when the housing 100 is assembled. The cover 200 may be slid into engagement using a front catch feature 202. The cover 200 may also have a back wall portion 204 that can complement and align with the rear sidewall portion 106 of the lower housing member 102 when the housing 100 is assembled. The side edge portions 206 of the cover 200 may include features to engage corresponding retention features proximate the inside top edge of the sidewall housing member 104. According to one embodiment as illustrated in FIG. 2, an underside 134 of the first floor portion 110 forms one section of an exterior bottom surface of the lower housing member 102. An underside 136 of the second floor portion 114 surrounds the boss 118 and forms another section of the exterior bottom surface of the lower housing member 102.

Figure 3:
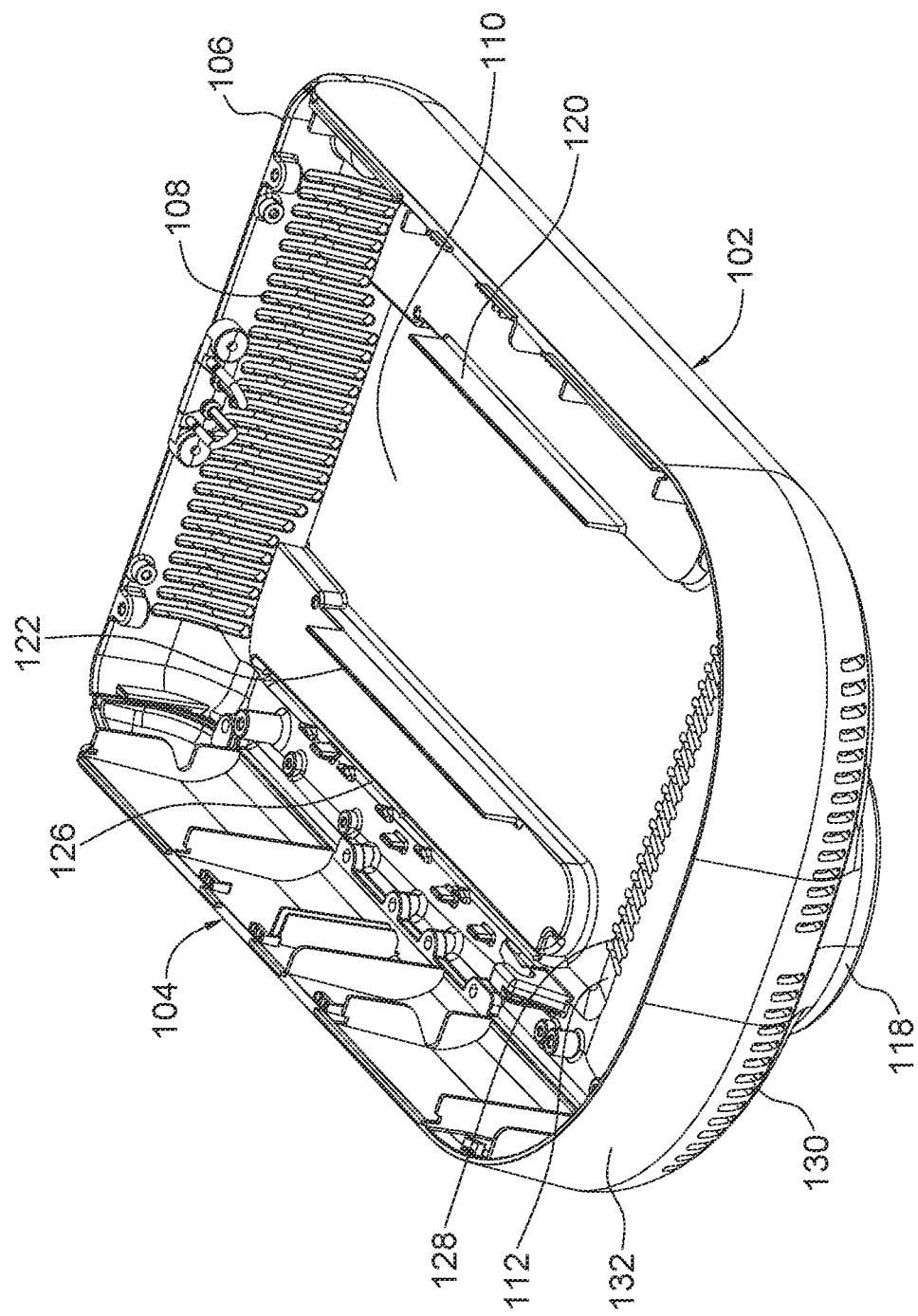
FIG. 3 illustrates a front perspective view of the housing of FIG. 1, showing the housing as partially assembled.

FIGS. 3-7 show various views of the housing 100 and the apparatus in which it is used in different states of assembly and disassembly. For example, FIG. 3 illustrates a front perspective view of the 100 showing the housing 100 as partially assembled without the cover 200. The sidewall housing member 104 fastens to the lower housing member 102 about the lower housing member's periphery and to the widthwise edges of the rear sidewall portion 106. The fastening may be achieved in any conventional manner, including through use of snap-fit connections, screws or other fasteners, or otherwise. The partial assembly view illustrated in FIG. 3 also allows the three air flow channels (central and two side channels 124, 126) to be more readily discernible.

FIG. 4 illustrates a bottom perspective view of an apparatus suitable for implementing an electronic device or system, which apparatus includes the housing 100 in accordance with an alternative exemplary embodiment of the present disclosure. As illustrated in FIG. 4, the apparatus includes the electrical connector 138 assembled in the opening 116 of lower housing member 102 and within the boss 118. The connector 138 is configured to provide electrical power to components housed in the housing 100, as well as to optionally facilitate communication of certain control signals (e.g., light controller control signals) and power in accordance with a digital addressable lighting interface (DALI) protocol. For example, as illustrated in FIG. 4, the connector 138 is shown as a 7-pin connector in which the three center pins/terminals provide alternating current (AC) power (Line, Load, and Neutral) to the apparatus and the other four pins/contacts are for use in communicating over a DALI bus or for other purposes.

FIG. 4 also provides better views of exemplary configurations and locations for the air exhaust ports 128, 130 according to one embodiment of the present disclosure. For example, the floor exhaust port 128 is shown in the transition portion 112 of the floor and the forward exhaust port 130 is shown in the lower half of the front sidewall portion 132. Also, the undersides 134, 136 of the floor portions 110, 114 are viewable in this view. The underside of the first floor portion 110 may include a pair of slots 402, 404 running in the lengthwise direction of the housing 100. The slots 402, 44 may be facilitate mechanical connection of the apparatus to other devices or structures, such as a streetlight-mounted pole clamp or bracket. According to one exemplary embodiment, the slots 402, 404 are positioned directly under the medial walls 120, 122 of the housing 100.

Figure 5:
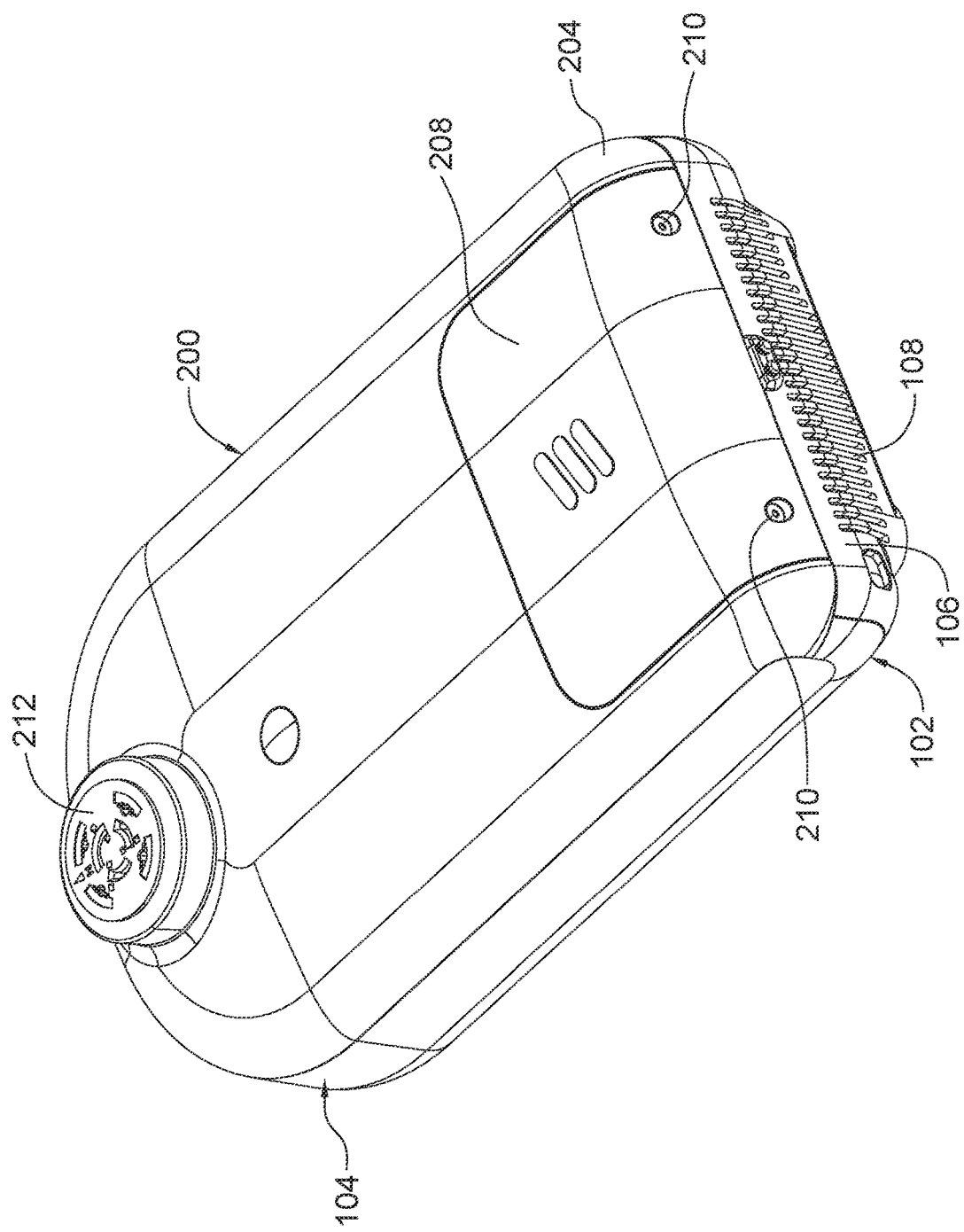
FIG. 5 illustrates a rear top perspective view of an assembled apparatus suitable for implementing an electronic device or system, in accordance with another alternative embodiment of the present disclosure.

FIG. 5 illustrates a rear top perspective view of an assembled apparatus suitable for implementing an electronic device or system, in accordance with another alternative embodiment of the present disclosure. As illustrated in FIG. 5, the cover may be configured to include a removable access door 208 that is held in place using, for example, captured screws or bolts 210 secured into countersunk holes in the access door 208. In this embodiment, the air intake port 108 is shown in the rear sidewall portion 106 of the lower housing member 102. Additionally, an electrical connector 212 may be included in and through the cover 200. The cover connector 212 may be similar to the floor electrical connector 138 on the underside of the apparatus, or may of a complementary configuration (e.g., including female power contacts instead of male power prongs. The cover connector 212 may reside in a sealed boss similar to the floor connector's boss 118. When included, the cover connector 212 facilitates the connection of the apparatus to other devices, such as an alternating current (AC) power tap, a Wi-Fi access point, an environmental sensor, or a photocontroller (where one is not already included in the apparatus) to control light output for a luminaire of a streetlight fixture to which the apparatus is mounted.

Figure 6:
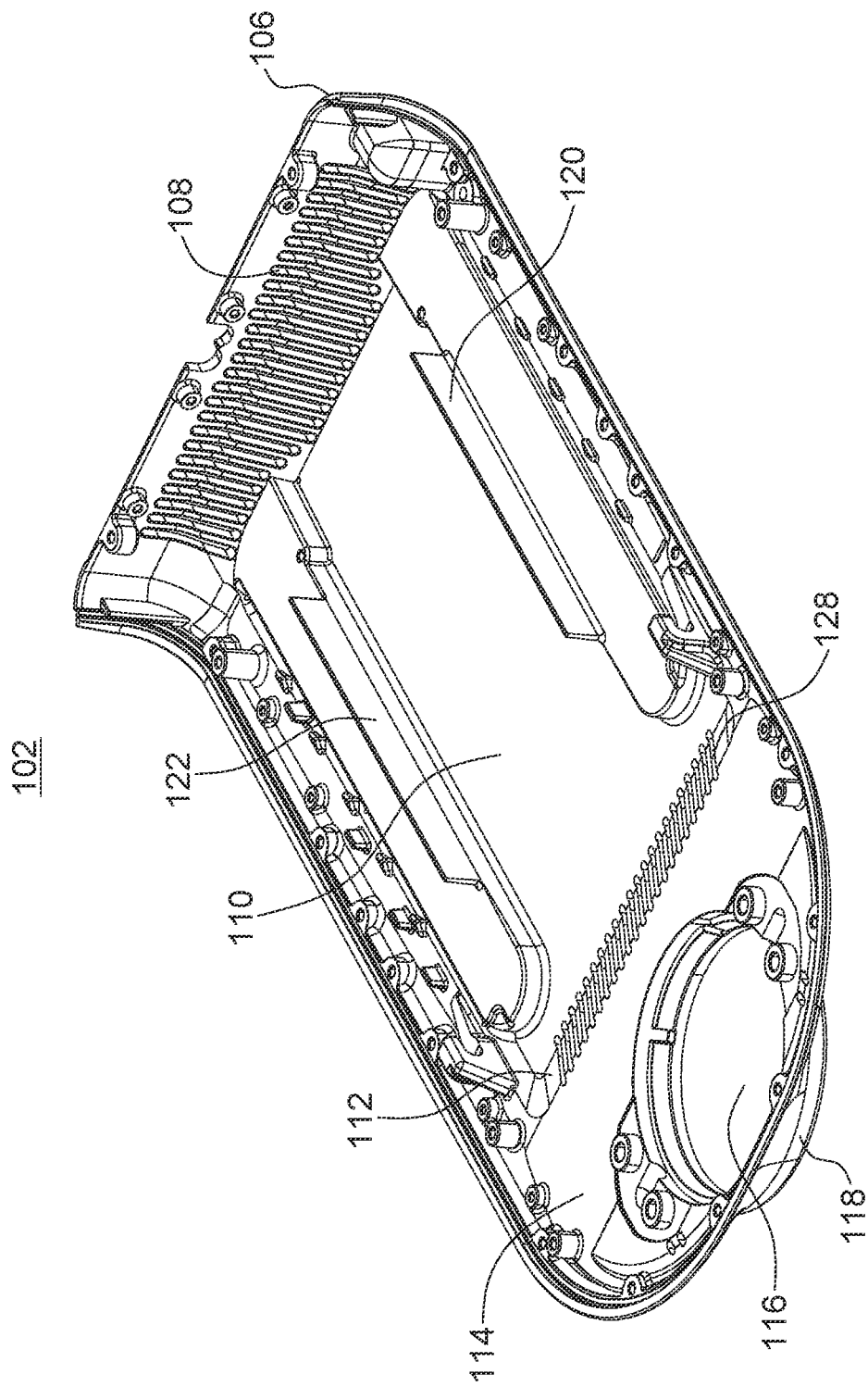
FIG. 6 illustrates a perspective view of a lower housing member of the housing of FIG. 1.

FIGS. 6 and 7 show, respectively, a perspective view of the lower housing member 102, and a side cut-away view of the lower housing member 102 for additional reference. In FIG. 7, the cut-away view is generally along a central line in the lengthwise direction (i.e., a longitudinal axis) of the lower housing member 102.

Figure 8:
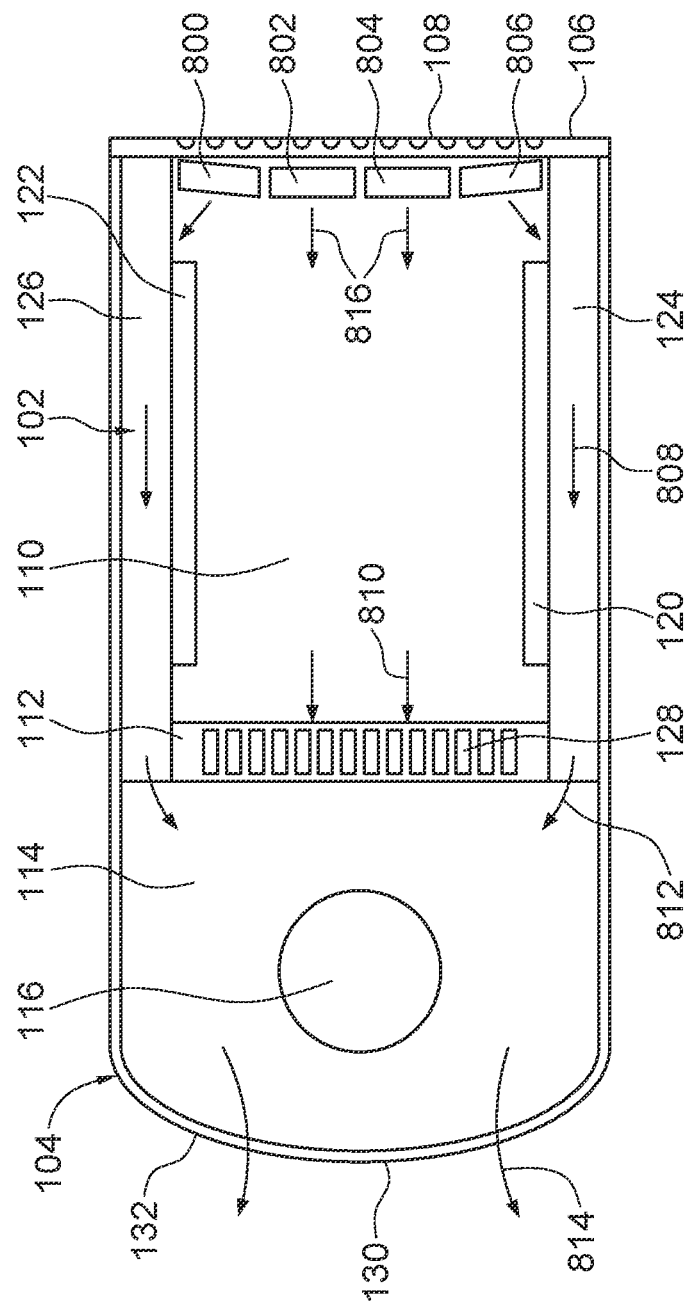
FIG. 8 illustrates a top plan view of the lower housing member of FIG. 6 with an exemplary set of fans positioned proximate an air intake port, in accordance with a further alternative embodiment of the present disclosure.

FIG. 8 illustrates a top plan view of the lower housing member 102 of FIG. 6 with an exemplary set of fans 800, 802, 804, 806 (four shown for illustrative purposes only) positioned generally in parallel with one another proximate the air intake port 108, in accordance with a further alternative embodiment of the present disclosure. When included, the fans 800, 802, 804, 806 draw air into the housing 100 through the intake port 108. The fans 800, 802, 804, 806 may abut the rear sidewall portion 106 of the lower housing member 102 or be spaced away from the rear sidewall portion 106 by a desired distance (e.g., 2-4 centimeters). The air drawn in through the air intake port 108 will be relatively cool compared to the temperature(s) of the heat-generating electrical module(s) residing within the housing 100. Depending on the quantity and positioning of the fans 800, 802, 804, 806, the fans 800, 802, 804, 806 may blow the in-drawn air over the first floor portion 110 and the second floor portion 114 through the air channels as indicated by arrows 816. The heated air exiting the main air channel is exhausted out of the housing 100 primarily through the floor exhaust port 128, as indicated by arrows 810. The outer fans 800, 806, which are positioned near the sidewall housing member 104, blow the in-drawn air through the side air flow channels 124, 126, as indicated, for example, by arrow 808. The outer fans 800, 806 may be positioned at a slight angle (e.g., 5-25 degrees) toward the sidewall housing member 104 and their respective side air flow channels 124, 126. The side air flow channels 124, 126 are formed, at least in part, between the medial walls 120, 122 and the corresponding portions of the sidewall housing member 104.

Figure 9:
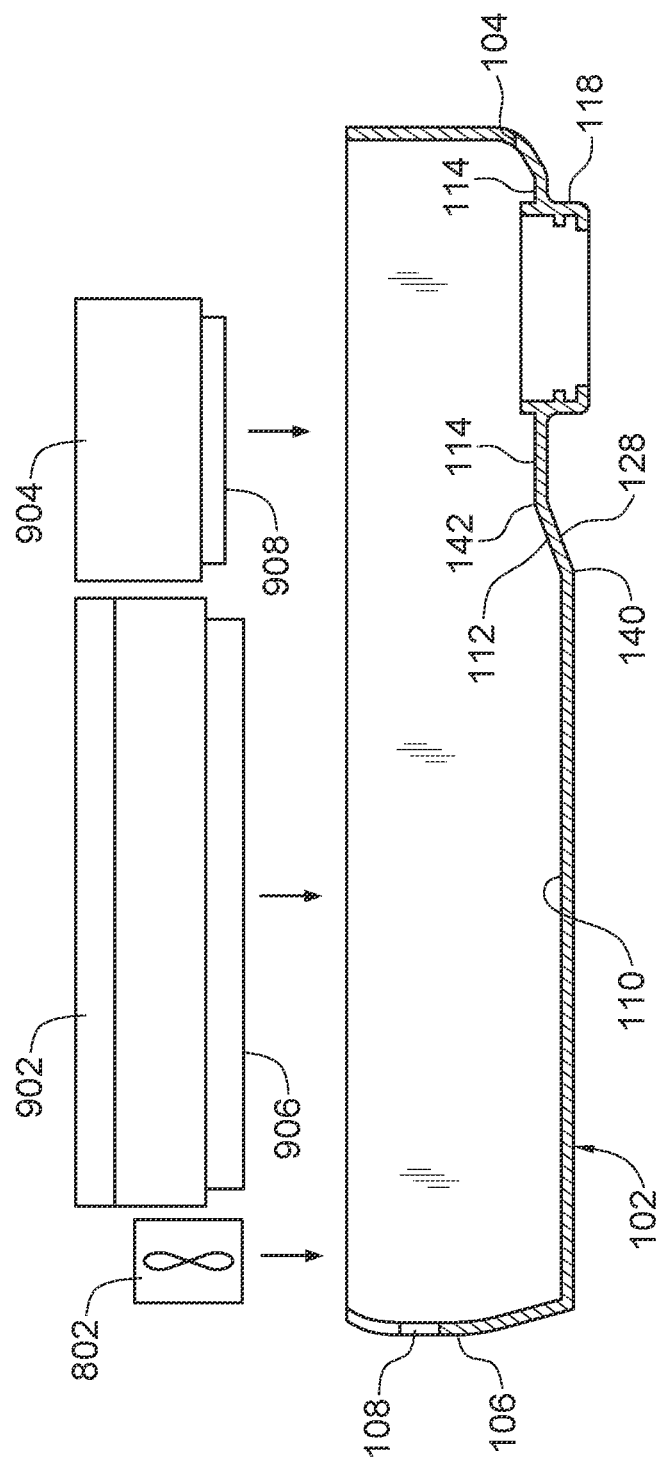
FIG. 9 illustrates a side exploded assembly view of an apparatus suitable for implementing an electronic device or system, wherein a lower housing member and a sidewall housing member of the apparatus are shown in cross-section, in accordance with yet another exemplary embodiment of the present disclosure.
Figure 10:
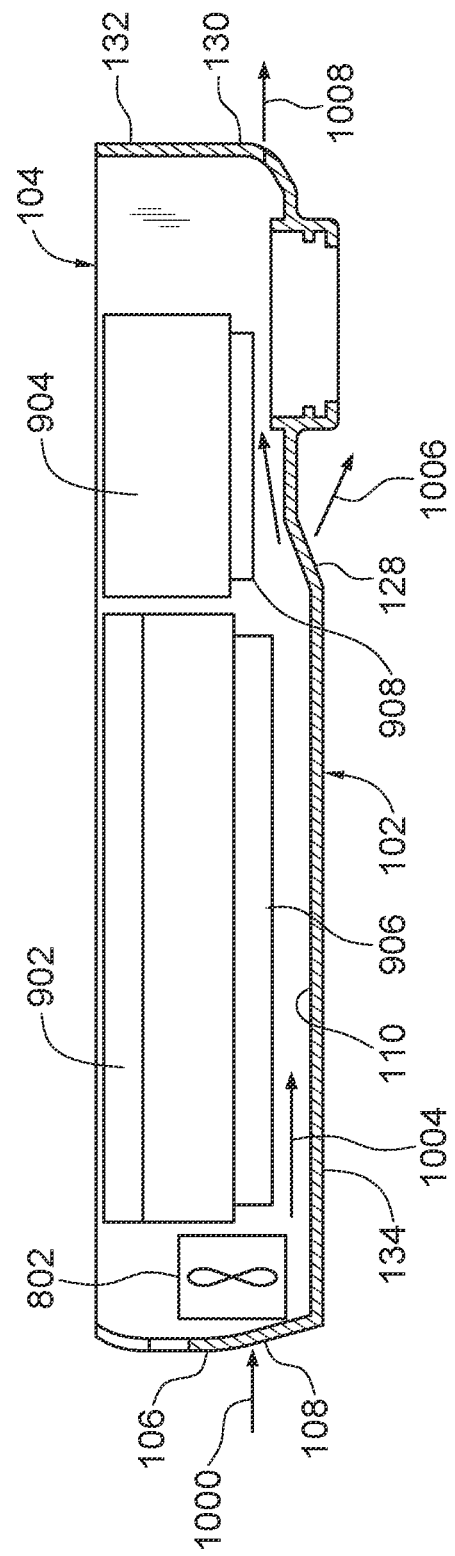
FIG. 10 illustrates a side cutaway view of the apparatus of FIG. 9 as assembled, showing air flow paths for thermal management, in accordance with exemplary embodiments of the present disclosure.

As illustrated in FIGS. 9 and 10, and discussed in more detail below, one or more heat-generating electrical modules may be positioned over and spaced apart from all or part of the first floor portion 110 and the second floor portion 114. Once so positioned, the main or central air flow channel may be formed by the inside surface of the first floor portion 110, the inside-facing surfaces of the medial walls 120, 122, and the external underside surface or surfaces of the one or more heat-generating electrical modules. Additionally, the outside air flow channels 124, 126 may be formed by the inside surface of the first floor portion 110, the outside-facing surfaces of the medial walls 120, 122, and the external underside surface or surfaces of the one or more heat-generating electrical modules. Where the one or more heat-generating electrical modules forming part of the central air flow channel include one or more heat sinks, the air flow created from the centrally positioned fans 802, 804 may pass air over and/or through the heat sink fins on the underside(s) of the heat-generating module(s) positioned over the first floor portion 110. Such air then becomes heated from the heat emanating from the heat sink fins and exits the housing 100 primarily through the first exhaust port 128. Air blown by the outer-positioned fans 800, 806 through the outer air flow channels 120, 122 may bypass the first exhaust port 128, as indicated, for example, by arrow 812, and exit the housing 100 primarily through the second exhaust port 130, as indicated by arrow 814. Where the one or more heat-generating electrical modules include one or more heat sinks, the external surfaces of the heat sink fins form the external surface or surfaces of the one or more heat-generating electrical modules for purposes of defining the respective air flow channels.

FIG. 9 illustrates a side exploded assembly view of an apparatus suitable for implementing an electronic device or system, wherein the lower housing member 104 and the sidewall housing member 104 of the apparatus are shown in cross-section, in accordance with yet another exemplary embodiment of the present disclosure. The lower housing member 102 and the sidewall housing member 104 are shown in cross-section so that locations of the first floor portion 110, the transition portion 112, and the second floor portion 114 can be seen relative to exemplary positioning of the one or more fans (fan 802 shown) and the one or more heat-generating electrical modules 902, 904. In the exemplary embodiment illustrated in FIG. 9, a first heat-generating electrical module 902 and a second heat generating module 904 are configured in a serial arrangement along the lengthwise direction of the lower housing member 102. The first heat generating electrical module 902 is positioned over the first floor portion 110 and optionally includes a finned heat sink 906 for drawing heat away from the electronic circuitry within the module 902. The first heat generating electrical module 902 may include one or more power amplifiers for transmitting high-rate digital cellular voice and data traffic, such as where the entire apparatus provides 5G or 6G small cell functionality.

The second heat-generating electrical module 904 is positioned over the transition portion 112, as well as partially over the first floor portion 110 and partially over the second floor portion 114. The second heat-generating electrical module 904 optionally includes a finned heat sink 908 for drawing heat away from the electronic circuitry within the module 904. The second heat-generating electrical module 904 may include, among other things, digital signal processors, a central processing unit, an AC-to-DC power supply (with AC power received via the electrical connector 138), a photocontroller, and low power wireless transceivers (such as for Global Positioning System (GPS) and/or low-rate cellular data applications). A power supply contained in the second heat-generating electrical module 904 may be used to supply direct current (DC) power to the one or more power amplifiers of the first heat-generating electrical module 902. Depending on the sensitivity of various components of the second heat-generating electrical module 904, the module 904 may be separated into two shielded modules or submodules configured in a stacked or side-by-side arrangement to improve electrical isolation, if necessary.

FIG. 10 illustrates a side cutaway view of the apparatus of FIG. 9 as assembled, showing exemplary air flow paths for thermal management. As shown in FIG. 10, the heat-generating electrical modules 902, 904 are positioned in a serial configuration above the first floor portion 110, the transition portion 112, and the second floor portion 114, such that the fins of the module heat sinks 906, 908 are spaced apart from the floor portions 110, 112, 114 permitting air flow through the heat sink fins and along the inside surfaces of the floor portions 110, 112, 114. The external underside surfaces of the heat-generating electrical modules 902, 904 (e.g., the external surfaces of the heat sinks 906, 908 in the embodiment illustrated in FIGS. 9 and 10) together with the medial walls 120, 122, the inside surfaces of the floor portions 110, 112, 114, and the inside surface or surfaces of the sidewall housing member 104 form one or more air flow channels through which air drawn in through the air intake port 108 may flow. In the embodiment shown in FIGS. 9 and 10, the fan(s) 802 (one shown) draws outside air in through the air intake port 108, as generally indicated by flow arrow 1000. The fan 802 blows or forces the in-drawn air through one or more air flow channels formed between the underside external surface(s) of the first heat-generating electrical module 902 (e.g., external surfaces of heat sink 906), the first floor portion 110, and side wall surfaces, which may be one or more of the inside surface(s) of the sidewall housing member 104 and/or surface(s) of one or more medial walls 120, 122, as generally indicated by flow arrow 1004. A portion of the forced air as heated by heat emanating from the first heat-generating electrical module 902 or otherwise generally within the housing 100 exits or is exhausted out of the housing 100 through the exhaust port 128 in the transition portion 112 of the floor, as generally indicated by flow arrow 1006. Additional forced air passes under and along the underside external surface(s) of the second heat-generating electrical module 904 (e.g., external surfaces of heat sink 908). The additional forced air as heated by heat emanating from the second heat-generating electrical module 904 and otherwise generally within the housing 100 exits or is exhausted out of the housing 100 through the exhaust port 130 in the front sidewall portion 132 of the sidewall housing member 104, as generally indicated by flow arrow 1008.

Figure 11:
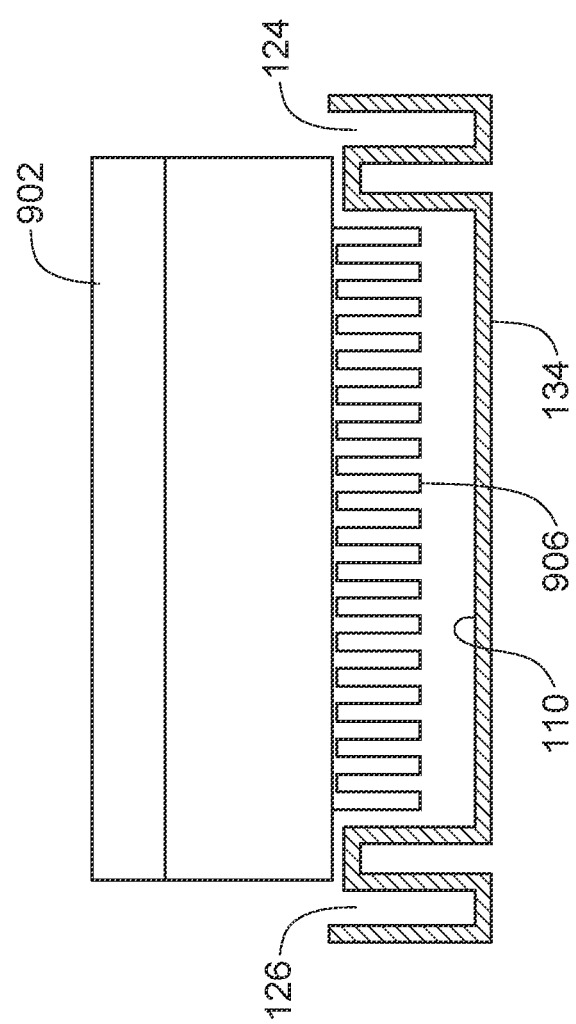
FIG. 11 illustrates in very general form a front cross-sectional view of the apparatus of FIG. 9 as assembled, showing formation of multiple air flow channels for thermal management, in accordance with some additional exemplary embodiments of the present disclosure.

FIG. 11 illustrates in very general form a front cross-sectional view of the apparatus of FIG. 9 as assembled, showing formation of multiple air flow channels for thermal management. As illustrated in an exemplary manner in FIG. 11, the first heat-generating electrical module 902 may be positioned upon the medial walls 120, 122 such that the module's heat sink 906 rests above the first floor portion 110 and between the medial walls 120, 122. In this configuration, a central air flow channel is formed between the first floor portion 110, the medial walls 120, 122, and external underside surfaces of the heat sink 906. Additionally, side air flow channels 124, 126 are formed between the medial walls 120, 122, the first floor portion 110, and sidewall portions of the sidewall housing member 104. While FIG. 11 illustrates three air flow channels, one of ordinary skill in the art will appreciate that more or less air flow channels may be formed and used depending on the thermal management needs of the particular apparatus.

As discussed above, some of the forced air from the fans 802, 804, 806, 808 passes under the first heat-generating electrical module 902, between the medial walls 120, 122 and through the fins of the module's heat sink 906 (when included). Such air becomes heated at least from heat emanating from the first heat-generating electrical module 902 and exits the housing 100 at least partially through the air exhaust port 128 in the transition portion 112 of the housing's floor. Other forced air from the fans 802, 804, 806, 808 passes through side air flow channels 124, 126 around or only partially under the first heat-generating electrical module 902 to the forward portion of the device for use in cooling the second heat-generating module 904. Such air becomes heated at least by the second heat-generating module 904 and exits the housing 100 at least partially through the air exhaust port 130 in the front sidewall portion 132 of the sidewall housing member 104.

It will be appreciated by those skilled in the art that the housing 100 can be formed as a combination of various members, or as a unitary member, which includes a multi-planar floor and sidewalls. In general, the housing 100 or housing assembly includes a floor having a first floor portion, a transition portion, and a second floor portion. Both the first and second floor portions are the lowermost surfaces inside the housing, with the second floor portion being elevated relative to the first floor portion and the transition portion interconnecting the first and second floor portions. The first and/or second floor portions may be planar in some embodiments but could alternatively be non-planar. For example, the first and second floor portions may be slightly angled to bias the flow of any water inside the housing 100 toward one or more of the air exhaust ports 128, 130 or toward other drainage features of the housing 100. The sidewall or sidewalls form the sides of the housing 100, positioned about a periphery or perimeter of the floor and extending generally in a direction orthogonal to the floor.

One exemplary embodiment of the electronic apparatus disclosed herein includes the housing 100 and one or more heat-generating electrical modules mounted inside the housing 100, which generate heat and need to be thermally managed to prevent performance problems caused by excessive temperature. One or more fans may be disposed inside the housing 100 to draw in ambient air from outside the housing 100 and force such air over the underside(s) of the heat-generating electrical module(s). In some embodiments, air flow channels can be used to route some of the forced air to particular sections of the housing 100 so as to provide thermal management for one or more heat-generating electrical modules located in those particular sections of the housing 100. Additionally, air exhaust ports may be strategically positioned in the floor and/or sidewalls of the housing 100 along the housing's length so as to exhaust hot air generated by one or more heat-generating electrical modules before the hot air reaches and possibly negatively affects one or more other heat-generating electrical modules. The disclosed electronic apparatus is well-suited for, among other things, implementing an exterior-mountable, multi-functional device or system that includes a small cell access node as one of the heat-generating electrical modules.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a medial wall or sidewall may be described as being mounted "substantially vertical" or "substantially orthogonal." In these cases, an element that is mounted exactly vertical or orthogonal is mounted along a "Y" axis and a "X" axis that is normal (i.e., 90 degrees or at a right angle) to a plane or line formed by a "Z" axis. Different from the exact precision of the term "vertical" or "orthogonal" and the use of "substantially" or "about" to modify the characteristic permits a variance of the particular characteristic by up to 30 percent.

The terms "include" and "comprise," as well as derivatives thereof in all of their syntactic contexts, are to be construed without limitation in an open, inclusive sense (e.g., "including, but not limited to"). The term "or" is inclusive, meaning "and/or." The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as "comprises" and "comprising," are to be construed in an open, inclusive sense (e.g., including, but not limited to).

Reference throughout this specification to "one embodiment" or "an embodiment" or "some embodiments" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity, as the case may be. In addition, the composition of "and" and "or" when recited herein as "and/or" is intended to encompass an embodiment that includes all of the associated items or characteristics and one or more other alternative embodiments that include fewer than all of the associated items or characteristics.

Except as the particular context may dictate otherwise, the singular shall mean the plural and vice versa. All pronouns shall mean and include the element or process to which they relate. Also, the masculine shall mean the feminine and vice versa.

The various embodiments described above may be combined to provide further embodiments. Aspects of the embodiments may also be modified to employ concepts of various patents, applications, and publications to provide yet further embodiments.

What is claimed is:

1. An apparatus comprising:
   a housing including a floor and at least one sidewall portion extending around a perimeter of the floor, the at least one sidewall portion including an air intake section located at a first end of the floor and a first air exhaust section located at a second end of the floor, the floor including a first floor portion residing primarily in a first plane, a second floor portion residing primarily in a second plane, and a transition portion interconnecting the first floor portion and the second floor portion, the transition portion including a second air exhaust section; and
   at least one heat-generating electrical module positioned over and spaced apart from the floor, wherein at least one air flow channel is defined between one or more inside surfaces of the floor and at least one external surface of the at least one heat-generating electrical module.

2. The apparatus of claim 1, wherein the transition portion is angled.

3. The apparatus of claim 1, wherein the at least one heat-generating electrical module includes:
   at least a first heat-generating electrical module positioned over and spaced apart from the first floor portion; and
   at least a second heat-generating electrical module positioned over and spaced apart from at least part of the second floor portion such that the first heat-generating electrical module and the second heat-generating electrical module are oriented in a generally serial alignment along a length of the housing, wherein the at least one air flow channel is defined between the inside surfaces of the first and second floor portions and external surfaces of the first and second heat-generating electrical modules.

4. The apparatus of claim 3, wherein heat generated by the first heat-generating electrical module is exhausted primarily out of the second air exhaust section.

5. The apparatus of claim 4, wherein heat generated by the second heat-generating electrical module is exhausted primarily out of the first air exhaust section.

6. The apparatus of claim 3, wherein heat generated by the second heat-generating electrical module is exhausted primarily out of the first air exhaust section.

7. The apparatus of claim 1, wherein the housing includes:
   a first housing member that includes the floor and a first sidewall portion of the at least one sidewall portion, the first sidewall portion being located at the first end of the floor and including the air intake section; and
   a second housing member that is connected to the first housing member and includes a second sidewall portion of the at least one sidewall portion, the second housing member including the first air exhaust section.

8. The apparatus of claim 1, further comprising:
   at least one fan positioned proximate the air intake section, the at least one fan being operable to draw air into the housing through the air intake section and force at least some of the air through the at least one air flow channel and out the first and second air exhaust sections.

9. The apparatus of claim 8, wherein the at least one fan comprises a plurality of fans arranged in parallel proximate the air intake section.

10. The apparatus of claim 9, further comprising:
a medial wall oriented substantially orthogonal to the first floor portion and extending at least part of a length of the first floor portion, the medial wall being located a first distance from a first sidewall of the at least one sidewall portion;
wherein the at least one air flow channel includes a first air flow channel and a second air flow channel, the first air flow channel being defined by at least the first floor portion, the medial wall, the first sidewall, and the at least one external surface of the at least one heat-generating electrical module, the second air flow channel being defined by at least the first floor portion, the medial wall, a second sidewall of the at least one sidewall portion, and the at least one external surface of the at least one heat-generating electrical module;
wherein at least a first fan of the plurality of fans is positioned in correspondence with the first air flow channel and at least a second fan of the plurality of fans is positioned in correspondence with the second air flow channel.

11. The apparatus of claim 9, further comprising:
a first medial wall oriented substantially orthogonal to the first floor portion and extending at least part of a length of the first floor portion, the first medial wall being located a first distance from a first sidewall of the at least one sidewall portion; and
a second medial wall oriented substantially orthogonal to the first floor portion and extending at least part of the length of the first floor portion, the second medial wall being located a second distance from a second sidewall of the at least one sidewall portion;
wherein the at least one air flow channel includes a central air flow channel, a first side air flow channel, and a second side air flow channel, the central air flow channel being defined by at least the first floor portion, the first medial wall, the second medial wall, and the at least one external surface of the at least one heat-generating electrical module, the first side air flow channel being defined by at least the first floor portion, the first medial wall, the first sidewall, and the at least one external surface of the at least one heat-generating electrical module, and the second side air flow channel being defined by at least the first floor portion, the second medial wall, the second sidewall, and the at least one external surface of the at least one heat-generating electrical module;
wherein at least a first fan of the plurality of fans is positioned in correspondence with the first side air flow channel, at least a second fan of the plurality of fans is positioned in correspondence with the second side air flow channel, and at least a third fan of the plurality of fans is positioned in correspondence with the central air flow channel.

12. The apparatus of claim 1, wherein the second floor portion defines an opening therethrough, the apparatus further comprising:
an electrical connector positioned in the opening and operational to provide electrical power to the at least one heat-generating electrical module.

13. The apparatus of claim 1, wherein the at least one heat-generating electrical module includes at least one power amplifier.

14. The apparatus of claim 1, wherein the at least one heat-generating electrical module includes a power supply.

15. The apparatus of claim 1, wherein each of the air intake section, the first air exhaust section, and the second air exhaust section defines a respective set of one or more apertures.

16. An apparatus comprising:
a housing including a floor and at least one sidewall portion extending around a perimeter of the floor, the at least one sidewall portion including an air intake section located at a first end of the floor and a first air exhaust section located at a second end of the floor, the floor including a first floor portion residing primarily in a first plane, a second floor portion residing primarily in a second plane, and an angled transition portion interconnecting the first floor portion and the second floor portion, the transition portion including a second air exhaust section;
at least one heat-generating electrical module positioned over and spaced apart from the floor, wherein at least one air flow channel is defined between one or more inside surfaces of the floor and at least one external surface of the at least one heat-generating electrical module; and
at least one fan positioned proximate the air intake section, the at least one fan being operable to draw air into the housing through the air intake section and force at least some of the air through the at least one air flow channel and out the first and second air exhaust sections.

17. The apparatus of claim 16, wherein the at least one heat-generating electrical module includes a first heat heat-generating electrical module and a second heat-generating electrical module, wherein heat generated by the first heat-generating electrical module is exhausted primarily out of the first air exhaust section, and wherein heat generated by the second heat-generating electrical module is exhausted primarily out of the second air exhaust section.

18. The apparatus of claim 16, wherein the at least one heat-generating electrical module includes:
at least a first heat-generating electrical module positioned over and spaced apart from the first floor portion; and
at least a second heat-generating electrical module positioned over and spaced apart from at least part of the second floor portion such that the first heat-generating electrical module and the second heat-generating electrical module are oriented in a generally serial alignment along a length of the housing, wherein the at least one air flow channel is defined between the inside surfaces of the first and second floor portions and external surfaces of the first and second heat-generating electrical modules.

19. The apparatus of claim 16, wherein the second floor portion defines an opening therethrough, the apparatus further comprising:
an electrical connector positioned in the opening and operational to provide electrical power to the at least one heat-generating electrical module.

20. An apparatus comprising:
a housing including a floor and at least one sidewall portion extending around a perimeter of the floor, the at least one sidewall portion including an air intake section located at a first end of the floor and a first air exhaust section located at a second end of the floor, the floor including a first floor portion residing primarily in a first plane, a second floor portion residing primarily in a second plane, and an angled transition portion interconnecting the first floor portion and the second floor portion, the transition portion including a second air exhaust section;
at least one heat-generating electrical module positioned over and spaced apart from the first floor portion and at least part of the second floor portion, wherein at least one air flow channel is defined between inside surfaces of the first and second floor portions and at least one external surface of the at least one heat-generating electrical module; and
at least one fan positioned proximate the air intake section, the at least one fan being operable to draw air into the housing through the air intake section and force at least some of the air through the at least one air flow channel and out the first and second air exhaust sections.

\* \* \* \* \*